United States Patent
Shen

(10) Patent No.: US 10,889,886 B2
(45) Date of Patent: Jan. 12, 2021

(54) CRUCIBLE, EVAPORATION PREPARATION DEVICE, EVAPORATION EQUIPMENT AND EVAPORATION METHOD

(71) Applicant: BOE TECHNOLOGY GROUP CO., LTD., Beijing (CN)

(72) Inventor: Yongqi Shen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 412 days.

(21) Appl. No.: 15/745,864

(22) PCT Filed: Aug. 1, 2017

(86) PCT No.: PCT/CN2017/095415
§ 371 (c)(1),
(2) Date: Jan. 18, 2018

(87) PCT Pub. No.: WO2018/149097
PCT Pub. Date: Aug. 23, 2018

(65) Prior Publication Data
US 2020/0102640 A1    Apr. 2, 2020

(30) Foreign Application Priority Data
Feb. 17, 2017    (CN) .......................... 2017 1 0086738

(51) Int. Cl.
*C23C 14/24*    (2006.01)
*C23C 14/26*    (2006.01)

(52) U.S. Cl.
CPC ............ *C23C 14/243* (2013.01); *C23C 14/26* (2013.01)

(58) Field of Classification Search
CPC ........ C23C 14/243; C23C 14/24; C23C 14/26
See application file for complete search history.

(56) References Cited

U.S. PATENT DOCUMENTS

| 2004/0050320 A1* | 3/2004 | Maruyama | C30B 23/00 117/84 |
| 2005/0022743 A1* | 2/2005 | Sakata | C23C 14/243 118/726 |

(Continued)

FOREIGN PATENT DOCUMENTS

| CN | 101736293 A * | 6/2010 | C23C 14/24 |
| CN | 102171388 A | 8/2011 | |

(Continued)

OTHER PUBLICATIONS

Maiti, Namita, et al., "An evaporation system for film deposition using electron beam sources". 2008 J. Phys.: Conf. Ser. 114 012049 (2008), pp. 1-7. doi:10.1088/1742-6596/114/1/012049.*

(Continued)

*Primary Examiner* — Bret P Chen
(74) *Attorney, Agent, or Firm* — Westerman, Hattori, Daniels & Adrian, LLP

(57) ABSTRACT

A crucible. The crucible includes a crucible body having an opening formed at the top thereof. The crucible further includes a sealing cover and an elastic element. The sealing cover is configured to seal the crucible in a first position and open the crucible in a second position. In the first position, the sealing cover forms a detachable sealed connection with the crucible body. The elastic element is arranged between the sealing cover and the crucible body, where the elastic element is in a compressed state when the crucible is sealed by the sealing cover in the first position. Correspondingly, the present disclosure also provides an evaporation preparation device, evaporation equipment and an evaporation method. The present disclosure can reduce the deterioration of the material to be evaporated and the direct contact between human body and the material.

14 Claims, 5 Drawing Sheets

(56) References Cited

U.S. PATENT DOCUMENTS

| | | | |
|---|---|---|---|
| 2008/0031720 A1* | 2/2008 | Seo .................... | C30B 15/02 |
| | | | 414/804 |
| 2010/0176530 A1* | 7/2010 | Yoshioka .............. | C03B 19/095 |
| | | | 264/114 |
| 2012/0270167 A1 | 10/2012 | Sato et al. | |
| 2013/0327653 A1* | 12/2013 | Dudley .................. | C25C 7/06 |
| | | | 205/354 |
| 2016/0252149 A1* | 9/2016 | Scharf .................. | F16F 13/10 |
| | | | 267/140.13 |
| 2017/0029938 A1* | 2/2017 | Hu ........................ | C23C 14/243 |
| 2017/0092899 A1* | 3/2017 | Bangert ............... | H01L 51/0011 |
| 2017/0178225 A1* | 6/2017 | Suzuki .................. | G06Q 10/10 |
| 2019/0085441 A1* | 3/2019 | Shen ..................... | C23C 14/243 |

FOREIGN PATENT DOCUMENTS

| | | | | |
|---|---|---|---|---|
| CN | 20317958 | * | 9/2013 | ............ C03B 5/08 |
| CN | 103388123 A | * | 11/2013 | ............ C23C 14/26 |
| CN | 205517836 U | | 8/2016 | |
| EP | 1433873 B1 | * | 9/2013 | ............ C23C 14/24 |
| JP | 7-100617 A | | 4/1995 | |
| WO | 2013/087060 A1 | | 6/2013 | |

OTHER PUBLICATIONS

Janssen, Y., et al., "Small sealed Ta crucible for thermal analysis of volatile metallic samples". Review of Scientific Instruments, vol. 77, 056104 (2006), pp. 1-3. https://doi.org/10.1063/1.2202923.*

Tiedje, H.F., et al., "Temperature stabilized effusion cell evaporation source for thin film deposition and molecular-beam epitaxy". Review of Scientific Instruments, vol. 71, No. 5, 2121-2124 (2000). https://doi.org/10.1063/1.1150592.*

International Search Report dated Nov. 23, 2017, issued in counterpart International Application No. PCT/CN2017/095415 (12 pages).

* cited by examiner

CRUCIBLE, EVAPORATION PREPARATION DEVICE, EVAPORATION EQUIPMENT AND EVAPORATION METHOD

PRIORITY INFORMATION

The present application claims priority to Chinese Application No. 201710086738.8, filed on Feb. 17, 2017, the entire contents of which are hereby incorporated by reference.

FIELD

The present disclosure relates to the field of manufacture of display device, in particular to a crucible, an evaporation preparation device, evaporation equipment and evaporation method.

BACKGROUND

Evaporation process is a method commonly used in manufacture of an organic electroluminescent display substrate. Generally, the evaporation process involves heating evaporation material inside a crucible in a vacuum chamber, so that the material in a solid form is converted to atoms, atomic groups or molecules in a gaseous form, followed by congealing on a surface of the substrate to be coated to form a film. The conventional crucible for evaporation is an open crucible, i.e., an opening is formed at the top of crucible. The evaporation material is placed in the crucible before evaporation, and then the crucible is placed in an evaporation chamber for heating and evaporating. In course of placing the evaporation material in the crucible and before entering the chamber, the evaporation material is exposed to the ambient atmosphere, since the crucible is an open crucible. For water-absorbent materials and active metal-based materials, water and oxygen components in the air can easily cause the deterioration of the material and thus affect the final evaporation process, and toxic materials may damage the health of the operator.

SUMMARY

The present disclosure provides a crucible, an evaporation preparation device, evaporation equipment and an evaporation method, so as to reduce the deterioration of the material to be evaporated and the direct contact between human body and the material.

In a first aspect, a crucible is provided. The crucible includes a crucible body having an opening at the top thereof. The crucible further includes a sealing cover having a detachable connection with the crucible body. The sealing cover is configured to seal the crucible body in a first position and open the crucible in a second position.

An elastic element is arranged between the sealing cover and the crucible body, where the elastic element is in a compressed state when the crucible is sealed by the sealing cover in the first position.

Optionally, the elastic element includes a torsion spring; one end of the torsion spring is arranged on the crucible body, and the other end of the torsion spring is arranged at a first edge of the sealing cover; the sealing cover is detachably connected to the crucible body by a connector at a second edge of the sealing cover opposite to the first edge.

Optionally, the crucible body includes a bottom wall and a side wall. The side wall of the crucible body includes an upright portion and a horizontal extension portion. One end of the horizontal extension portion is connected to the top end of the upright portion, and the other end of the extending portion extends toward the outside of the crucible body. One end of the torsion spring is arranged on the horizontal extension portion. The horizontal extension portion of the crucible body is detachably connected to the second edge of the sealing cover opposite to the first edge by the connector.

Optionally, the connector includes a snap-fit; one end of the snap-fit is articulated to the sealing cover, and the other end of the snap-fit is provided with a hook for being blocked and connected with the horizontal extension portion.

Optionally, a first sealing gasket is arranged on the horizontal extension portion, and the first sealing gasket is a closed annular structure surrounding the axis of the crucible body.

Optionally, a bottom surface of the cover body, and the second sealing gasket is a closed annular structure surrounding the axis of the sealing cover.

In a second aspect, an evaporation preparation device is provided. The device includes a glove box and a crucible configured to be disposed in the glove box. The crucible includes a crucible body having an opening at the top thereof. The crucible further includes a sealing cover having a detachable connection with the crucible body. The sealing cover is configured to seal the crucible body in a first position and open the crucible in a second position. An elastic element is arranged between the sealing cover and the crucible body, where the elastic element is in a compressed state when the crucible is sealed by the sealing cover in the first position.

Optionally, the glove box comprises a box body and a glove; the box body is provided with an inlet, an inlet door for opening and closing the inlet, and a glove joint; the glove forms a sealed connection with the glove joint.

Optionally, the inlet is configured for the crucible to enter the box body through the inlet.

Optionally, the box body is provided with a gas pressure regulation structure for regulating the gas pressure within the box body.

Optionally, the box body is provided with a gas inlet, the gas inlet is communicated with a source of an inert gas.

In a third aspect, an evaporation equipment is provided. The evaporation equipment includes an evaporation chamber communicated with an evacuating device. The evaporation equipment further includes the evaporation preparation device according above.

In a fourth aspect, an evaporation method is provided using the evaporation equipment above. The evaporation method may include: placing the crucible in the box body of the glove box; placing material to be evaporated in the crucible body in the box body by the glove of the glove box; regulating the gas pressure within the box body so as to be lower than the ambient atmospheric pressure; the sealing cover forming a sealed connection with the crucible body; transferring the crucible from the glove box to the evaporation chamber; after removing the crucible from the glove box and before placing the crucible in the evaporation chamber, releasing the sealed connection between the sealing cover and the crucible body; and evacuating the evaporation chamber.

Optionally, before placing the crucible and the material to be evaporated in the box body of the glove box, the evaporation method may further include: filling the box body of the glove box with an inert gas.

BRIEF DESCRIPTION OF THE DRAWINGS

The drawings are used to illustrate the embodiments of present disclosure, and the drawings are merely a portion of embodiments of present disclosure. It is to be understood that the drawings and the specific embodiments described herein are for the purpose of illustration and explanation only and are not intended to limit the disclosure. In the drawings.

DETAILED DESCRIPTION OF ILLUSTRATED EMBODIMENTS

Figure 1A:
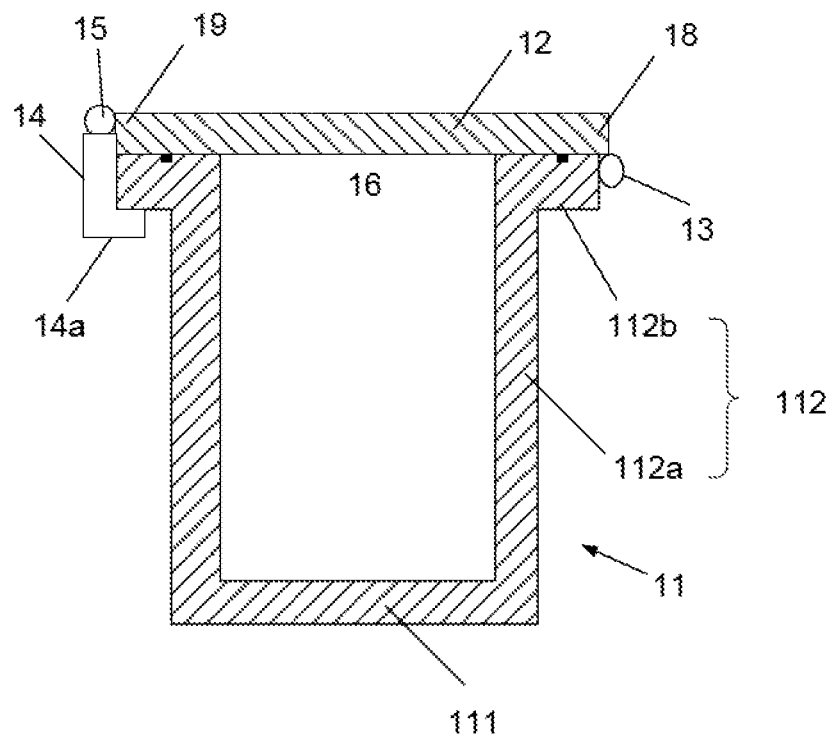
FIG. 1A is a schematic view illustrating a crucible according to some embodiments of the present disclosure when the crucible is fully sealed by the cover in a first position.

The present disclosure will now be illustrated by way of the following examples and with reference to the figures. It is to be understood that the specific embodiments described herein are for the purpose of illustration and explanation only and are not intended to limit the disclosure.

The present disclosure is directed to solving at least one of the technical problems existing in the prior art. The present disclosure provides a crucible, an evaporation preparation device, evaporation equipment and an evaporation method, so as to reduce the deterioration of the material to be evaporated and the direct contact between human body and the material.

In order to at least partially solve or alleviate one of the above technical problems, the present disclosure provides a crucible, comprising a crucible body having an opening formed at the top thereof; wherein the crucible further comprises a sealing cover and an elastic element; the sealing cover forms a detachable sealed connection with the crucible body, so that the sealing cover can seal or open the crucible; the elastic element is arranged between the sealing cover and the crucible body, and the elastic element is in a compressed state when the opening is sealed with the sealing cover.

Preferably, the elastic element comprises a torsion spring; one end of the torsion spring is arranged on the crucible body, and the other end of the torsion spring is arranged at the edge of the sealing cover; the portion of the edge of the sealing cover which is not arranged with the torsion spring is detachably connected to the crucible body by a connector.

Preferably, the crucible body comprises a bottom wall and a side wall; the side wall of the crucible body comprises an upright portion and a horizontal extension portion; one end of the horizontal extension portion is connected to the top end of the upright portion, and the other end of the extending portion extends toward the outside of the crucible body.

One end of the torsion spring is arranged on the horizontal extension portion; the portion of the edge of the sealing cover which is not arranged with the torsion spring is detachably connected to the horizontal extension portion of the crucible body by a connector.

Preferably, the connector comprises a snap-fit. One end of the snap-fit is articulated to the sealing cover, and the other end of the snap-fit is provided with a hook for being blocked and connected with the horizontal extension portion.

Preferably, a first sealing gasket is arranged on the horizontal extension portion, and the first sealing gasket is a closed annular structure surrounding the axis of the crucible body; and/or, the sealing cover comprises a cover body and a second sealing gasket which is arranged on the bottom surface of the cover body, and the second sealing gasket is a closed annular structure surrounding the axis of the sealing cover.

Correspondingly, the present disclosure provides an evaporation preparation device, comprising a glove box and the crucible according to the present disclosure. The glove box comprises a box body and a glove; the box body is provided with an inlet, an inlet door for opening and closing the inlet, and a glove joint; the glove forms a sealed connection with the glove joint. The crucible enters the box body through the inlet. The box body is provided with a gas pressure regulation structure for regulating the gas pressure within the box body.

Preferably, the box body is provided with a gas inlet, the gas inlet is communicated with a source of an inert gas.

Correspondingly, the present disclosure provides evaporation equipment, comprising an evaporation chamber communicated with an evacuating device. The evaporation equipment further comprises the evaporation preparation device according to the present disclosure.

Correspondingly, the present disclosure still provides an evaporation method using the evaporation equipment according to the present disclosure, comprising:
placing the crucible in the box body of the glove box;
placing the material to be evaporated in the crucible body in the box body by the glove of the glove box;
regulating the gas pressure within the box body so as to be lower than the ambient atmospheric pressure;
the sealing cover forming a sealed connection with the crucible body;
transferring the crucible from the glove box to the evaporation chamber, after removing the crucible from the glove box and before placing the crucible in the evaporation chamber, releasing the sealed connection between the sealing cover and the crucible body;
evacuating the evaporation chamber.

Preferably, before the step of placing the crucible and the material to be evaporated in the box body of the glove box, the evaporation method further comprises filling the box body of crucible body with an inert gas.

It can be seen that when the crucible body is filled with the material to be evaporated before evaporation, the crucible and the packaged material to be evaporated can be placed in the box body of the glove box. An operator puts his hands into the box body through the gloves, and places the material in the crucible body, thereby preventing the operator from direct contact with the material that is harmful to the body. Thereafter, the gas pressure within the box body is regulated to be lower than the ambient atmospheric pressure by the gas pressure regulation structure. Thereafter, the sealing cover forms a detachable sealed connection with the crucible body to ensure that the gas pressure within the crucible body is lower than the ambient atmospheric pressure. Therefore, even if the sealed connection between the sealing cover and the crucible body is released when the crucible is removed from the glove box and placed in an ambient atmospheric atmosphere, the sealing cover can still maintain the sealing of the opening in the ambient atmospheric atmosphere; until the gas pressure within an evaporation chamber is evacuated to be equivalent to the gas pressure within the crucible body after placing the crucible in the evaporation chamber, the sealing cover is opened by the elastic force of the elastic element. And the glove box can be filled with an inert gas in advance, so that the material in the crucible body does not contact with water vapor, oxygen and the like in course of placing the material in the crucible and sealing the opening with the sealing cover before the sealing cover is opened, thereby preventing the material from deteriorating, and improving the evaporation effect.

Figure 1B:
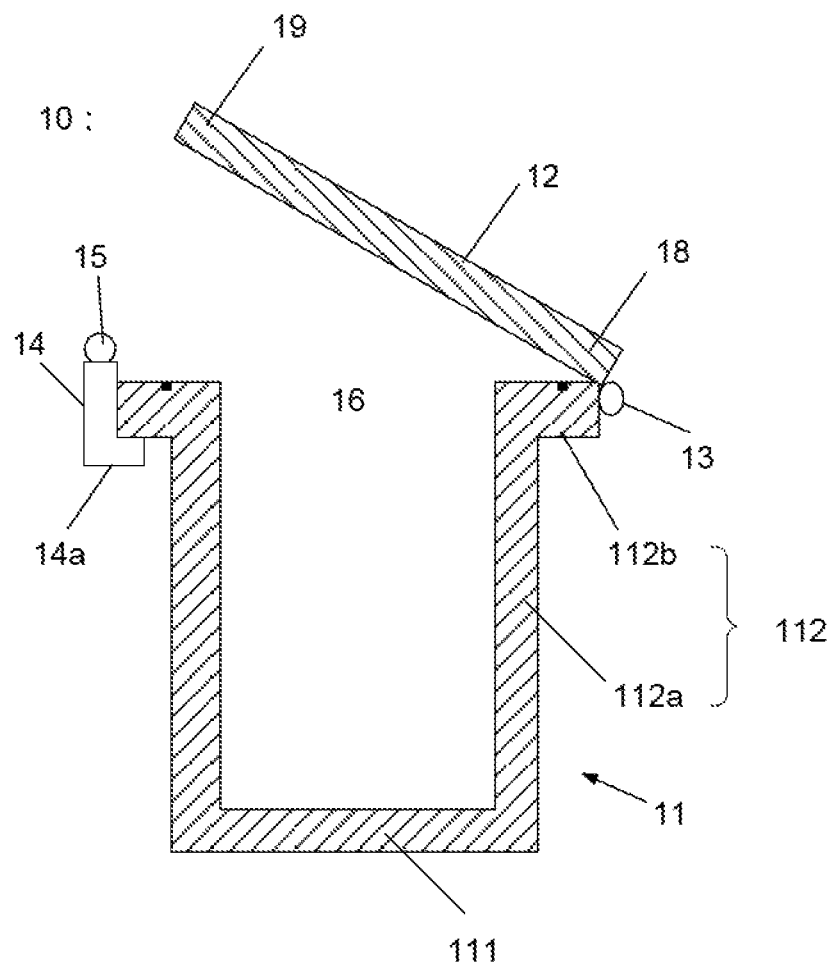
FIG. 1B is a schematic view illustrating a crucible according to some embodiments of the present disclosure when the crucible is partially open.

The first aspect of the present disclosure provides a crucible illustrated in FIG. 1A and FIG. 1B. The crucible comprises a crucible body 11, a sealing cover 12, and an elastic element 13. The sealing cover has a first edge 18 and a second edge 19 opposite to the first edge 21. An opening 16 is formed at the top of crucible body 11. The crucible body 11 is used for holding the material to be evaporated. When evaporating, the material in the crucible body 11 is heated to form vapor, and then the vapor goes upward for evaporation through the opening 16. The sealing cover 12 forms a detachable sealed connection with the crucible body 11, so that the sealing cover 12 can seal or open the crucible by seal or open the opening 16. The elastic element 13 is arranged between the sealing cover 12 and the crucible body 11, and the elastic element 13 is in a compressed state when the opening 16 is sealed with the sealing cover 12.

Here, the sealing cover 12 forms a detachable sealed connection with the crucible body 11. The sealing cover is configured to seal the crucible in a first position and open the crucible in a second position. In the first position, the sealing cover forms a detachable sealed connection with the crucible body. As shown in FIG. 1A, when the opening 16 is sealed by the sealing cover 12 in the first position, the sealing cover 12 and the crucible body 11 form a sealed container. As shown in FIG. 1B, when the opening 16 is not completely sealed by the sealing cover 12, the sealing cover 12 and the crucible body 11 form a partially opened container.

The sealing cover 12 herein can be arranged as follows: a portion of the sealing cover 12 is connected together with the crucible body 11, and the other portion is detachably connected (i.e., capable of being connected or separated) to the crucible body 11. Alternatively, the sealing cover 12 herein can also be arranged to be independent from the crucible body 11 and detachably connected to the crucible, and the seal cover 12 can seal the opening 16 when connected. The sealing cover 12 can be detachably connected to the crucible body 11 by a connector such as a screw, a snap-fit, and the like. Alternatively, the sealing cover 12 is detachably connected to the crucible body 11 by engagement structure.

It is noted that the elastic element 13 may satisfy following conditions: when the sealed connection between the sealing cover 12 and the crucible body 11 is released, i.e., the sealing cover 12 is only placed on the crucible body 11, and at most one position of the sealing cover 12 is connected to the crucible body 11, and no external force is applied to the sealing cover, the sealing cover can be opened by the elastic restoring force of the elastic element.

The crucible body 11 is filled with the material to be evaporated in an environment where the gas pressure is lower than the ambient atmospheric pressure. For example, the material to be evaporated may include at least one of the following organic material: tris(8-hydroxyquinolinato) aluminium, Alq3, and NPB. After filling, the opening 16 is sealed with the sealing cover 12, so that the gas pressure within the crucible body 11 is kept lower than the ambient atmospheric pressure. Thereafter, the crucible 10 is placed in an evaporation chamber, and the sealed connection between the sealing cover 12 and the crucible body 11 is released before the crucible 10 being placed in the evaporation chamber or before the evaporation chamber being evacuated (evaporation process is carried out in a vacuum state). Since the ambient atmospheric pressure is greater than the gas pressure within the crucible body 11, even if the sealed connection between the sealing cover 12 and the crucible body 11 is released, the opening 16 is still sealed by the sealing cover 12, so that the contact between the evaporation material and the water vapor, oxygen in the outside air can be reduced, and the damage to the human body can be reduced. When the gas pressure within the evaporation chamber is reduced to be equivalent to the gas pressure within the crucible body 11, the sealing cover 12 is opened by the elastic restoring force of the elastic element to ensure the normal operation of the subsequent evaporation.

Furthermore, in order to further reduce the contact between the evaporation material and the outside air, the environment where the gas pressure is lower than the ambient atmospheric pressure shown above can be an inert gas environment where the gas pressure is lower than the ambient atmospheric pressure. Specifically, the environment can be a glove box filled with an inert gas, and the glove box is provided with a gas pressure regulation structure. The process of filling the crucible body by using the glove box will be described below, without further details here.

The structure of the elastic element 13 and the connection types between the sealing cover 12 and the crucible body 11 are not specifically limited in the present disclosure. For example, the elastic element 13 can be an upright coil spring. An installation slot is arranged on a side wall of the crucible body 11, the coil spring is arranged in the installation slot, and a top end of the coil spring is exposed, so that the coil spring is in the compressed state when the sealing cover 12 forms a detachable sealed connection with the crucible body 11 to seal the opening 16. When the connection between the sealing cover 12 and the crucible body 11 is released and no other external force is applied to the sealing cover 12, the coil spring generates an upward restoring force, thereby lifting the sealing cover 12 upwards.

In order to make the sealing cover 12 more effective for sealing the opening and facilitate the opening of the sealing cover 12 under the elastic force of the elastic element 13, the elastic element 13 comprises a torsion spring. Referring to FIG. 1A and FIG. 2B, one end of the torsion spring 13a is arranged on the crucible body 11, and the other end of the torsion spring 13b is arranged at the edge of the sealing cover 12. The portion of the edge of the sealing cover 12 which is not arranged with the torsion spring is detachably connected to the crucible body 11 by the connector 14, so that the sealing cover 12 can form a sealed connection with the crucible body 11 by the joint connection of the connector 14 and the elastic element 13, and then, the opening is sealed by the sealing cover 12.

Figure 2A:
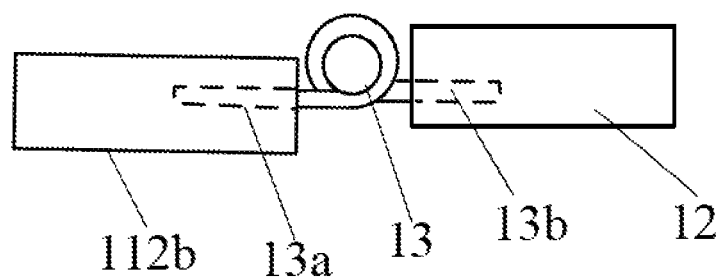
FIG. 2A is a schematic view illustrating the state of the sealing cover when the elastic element is in an initial state.
Figure 2B:
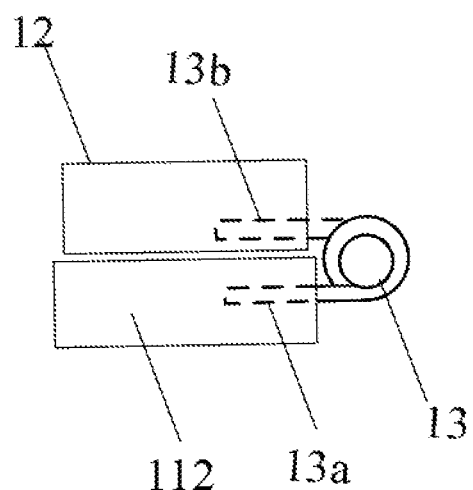
FIG. 2B is a schematic view illustrating the state of the sealing cover when the elastic element is in a compressed state.

It should be noted that the initial state of the torsion spring is shown in FIG. 2A, the ends of torsion spring (13a and 13b) are present in a certain angle, preferably, the angle ranging from 160° to 180°, so that the angle between the sealing cover 12 and the plane of the opening is in the range of 160° to 180° when the torsion spring is in the initial state, preferably 180°. When the torsion spring is in the initial state, the cover is in the second position.

When the torsion spring is in the compressed state, i.e., the angle between the ends 13a and 13b is about 0°, the cover is in the first position. Therefore, the sealing cover 12 forms a sealed connection with the crucible body 11 when the cover is in the first position. When the connection between the sealing cover 12 and the crucible body 11 is released, and the sealing cover 12 is free from other external forces, the torsion spring returns to the initial state, so that the sealing cover 12 can be sufficiently opened without affecting the range of evaporation.

Specifically, as shown in FIG. 1A, the crucible body 11 includes a bottom wall 111 and a side wall 112. The side wall 112 of the crucible body 11 comprises an upright portion 112a and a horizontal extension portion 112b. One end of the horizontal extension portion 112b is connected to the top end of the upright portion 112a, and the other end of the extending portion 112b extends toward the outside of the crucible body 11. The portion of the edge of the sealing cover 12 which is not arranged with the torsion spring is detachably connected to the horizontal extension portion 112b of the crucible body 11 by the connector 14. One end of the torsion spring 13a is arranged on the crucible body 11, specifically, arranged on the horizontal extension portion 112b (as shown in FIGS. 2a and 2b). Further specifically, the connector 14 comprises a snap-fit. One end of the snap-fit is articulated to the sealing cover 12 with an articulation piece such as a hinge 15 and the like, and the other end of the snap-fit is provided with a hook 14a for being blocked and connected with the horizontal extension portion 112b. Hereinto, the number of snap-fit can be one or more. In the present disclosure, one snap-fit can be provided and the position of snap-fit is opposed to the position of the elastic element 13, thereby simplifying the structure, and ensuring that a better sealing effect can be achieved when the sealing cover 12 is connected to the crucible body 11 with the snap-fit.

Certainly, the connector 14 can also be other connecting pieces such as screw and the like, the connector can be arranged on the sealing cover 12, or arranged on the horizontal extension portion 112b. Alternatively, the connector 13 can be a separate U-shaped fixture to hold the horizontal extension portion 112b of the crucible body 11 and the sealing cover 12 together.

Figure 3:
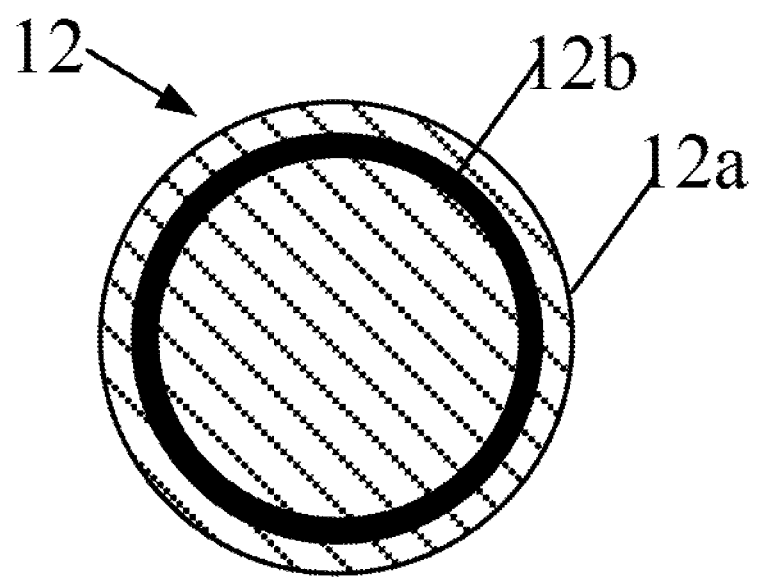
FIG. 3 is a bottom view illustrating a sealing cover.

In order to further improve the sealing effect on the opening when the sealing cover 12 is connected to the crucible body 11, a first sealing gasket is arranged on the horizontal extension portion 112b, and the first sealing gasket is a closed annular structure surrounding the axis of the crucible body 11; and/or, as shown in FIG. 3, the sealing cover 12 comprises a cover body 12a and a second sealing gasket 12b which is arranged on the bottom surface of the cover body 12a, and the second sealing gasket 12b is a closed annular structure surrounding the axis of the sealing cover 12. Understandably, the axis of the sealing cover 12 is an axis along the thickness direction of the sealing cover.

Figure 4:
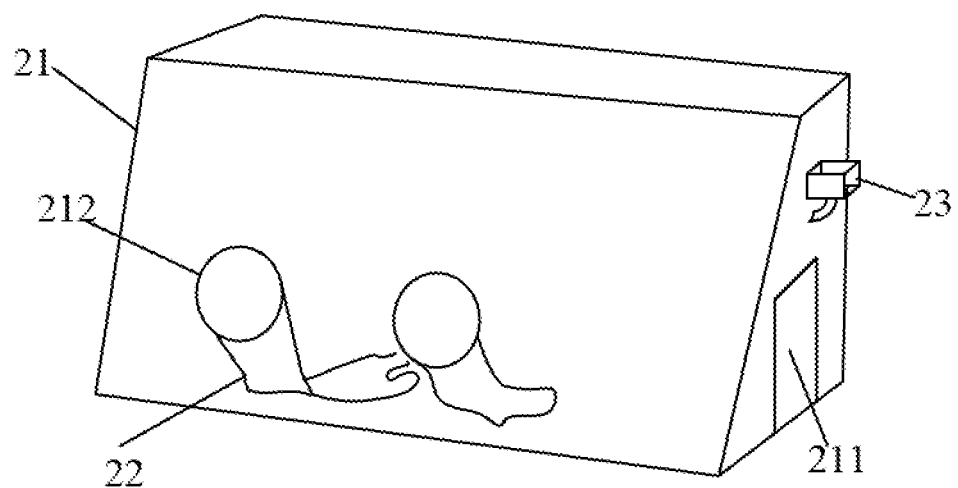
FIG. 4 is a schematic view illustrating a glove box according to some embodiments of the present disclosure.

The second aspect of the present disclosure provides an evaporation preparation device for carrying out evaporation preparation before evaporation. The evaporation preparation device comprises a glove box and the crucible 10 as described above. As shown in FIG. 4, the glove box comprises a box body 21 and gloves 22. The box body 21 is provided with an inlet, an inlet door 211 for opening and closing the inlet, and glove joints 212. The gloves 22 form sealed connection with the glove joints 212. The crucible 10 can enter the box body 21 through the inlet. The box body 21 is provided with a gas pressure regulation structure 23 for regulating the gas pressure within the box body 21.

When the crucible 10 is filled with the material to be evaporated, the crucible 10 and the packaged material to be evaporated can be placed in the box body 21 of the glove box. The operator puts his hands into the box body 21 through the gloves, and places the material in the crucible body 11, thereby preventing the operator from direct contact with the material that is harmful to the human body. Thereafter, the gas pressure within the box body 21 is regulated to be lower than the ambient atmospheric pressure by the gas pressure regulation structure 23, thereby providing the crucible body 11 with the "the environment where the gas pressure is lower than the ambient atmospheric pressure". Thereafter, the sealing cover 12 forms a detachable sealed connection with the crucible body 11 to ensure that the gas pressure within the crucible body 11 is lower than the ambient atmospheric pressure. Therefore, even if the sealed connection between the sealing cover 12 and the crucible body 11 is released when the crucible 10 is removed from the glove box and placed in an ambient atmospheric atmosphere, the sealing cover 12 can still maintain the sealing of the opening in the ambient atmospheric atmosphere; until the gas pressure outside the crucible body 11 is reduced to be equivalent to the gas pressure within the crucible body 11, the sealing cover 12 is opened by the elastic force of the elastic element 13. In course of placing the material in the crucible body 11 and sealing the opening with the sealing cover 12, the pressure within the crucible body 11 remains low before the sealing cover 12 is opened, i.e., the amount of gas is small, so that deterioration caused by the contact between the material and the water vapor, oxygen and the like can be reduced, and the evaporation effect can be improved.

In practical application, an elastic element 13 can be used in combination with the gas pressure regulation structure 23 to regulate the pressure within the box body 21. The pressure within the box body 21 is regulated by an elastic force generated when the elastic element 13 returns back to the initial state from a compressed state. Therefore, when the connection between the sealing cover 12 and the crucible body 11 is released and the crucible body 11 is placed in the ambient atmospheric atmosphere, it can be ensured that the differential pressure between the ambient atmosphere and the crucible body 11 is enough to maintain the sealed contact between the sealing cover 12 and the crucible body 11 without the sealing cover 12 being opened by the elastic element 13.

In order to further reduce the deterioration of the material due to the contact with water vapor and oxygen, the box body 21 is provided with a gas inlet (not shown in FIGS.). The gas inlet is communicated with a source of an inert gas to introduce inert gas into the box body 21. So that the material to be evaporated is in an inert gas environment to prevent deterioration from the unpacking to the beginning of the evaporation.

The third aspect of the present disclosure provides evaporation equipment. The evaporation equipment comprises an evaporation chamber and the evaporation preparation device as described above. The evaporation chamber is communicated with an evacuating device. Prior to evaporation, the evaporation chamber is evacuated by the evacuating device to carry out evaporation in a vacuum atmosphere.

The fourth aspect of the present disclosure provides an evaporation method by using evaporation equipment for evaporation. Referring to FIGS. 1 to 4, the evaporation method comprises:

At step 1, the crucible 10 is placed in the box body 21 of the glove box.

At step 2, the material to be evaporated is placed in the crucible body 11 by the gloves 22 of the glove box. Understandably, the material to be evaporated is placed in the box body 21 in the case of packaging. In the process, the material to be evaporated will not be in direct contact with the operator. Thereafter, the operator can open the sealed bag containing the material by the glove, and put the material in the box body 21, in the process, the material will not be in direct contact with the operator.

At step 3, the gas pressure within the box body 21 is regulated to be lower than the ambient atmospheric pressure.

At step 4, the sealing cover 12 forms a sealed connection with the crucible body 11.

At step 5, the crucible 10 is transferred from the glove box to the evaporation chamber. After the crucible 10 is removed from the glove box and before the crucible 10 is placed in the evaporation chamber, the sealed connection between the sealing cover 12 and the crucible body 11 is released. The sealed connection between the sealing cover 12 and the crucible body 11 is released means that at most on position of the sealing cover 12 is connected to the crucible body 11, and the other positions are no longer connected, so that once the sealing cover 12 is subjected to an upward pressure which greater than the gravity of sealing cover, the sealing cover 12 can be opened. As described above, the elastic element 13 comprises a torsion spring. The other end of the torsion spring 13b is arranged at the edge of the sealing cover 12. The portion of the edge of the sealing cover 12 which is not arranged with the torsion spring is detachably connected to the crucible body 11 with the snap-fit, and at this time, the step 4 refers to closing the snap-fit, so that the sealing cover 12 seals the opening of the crucible body 11. Releasing the sealed connection between the sealing cover 12 and the crucible body 11 of the step 5 refers to opening the snap-fit.

At step 6, the evaporation chamber is evacuated.

At step 7, the crucible in the evaporation chamber is heated to carry out evaporation.

Hereinto, an elastic element 13 can be used to regulate the pressure within the box body 21. The pressure within the box body 21 is regulated by an elastic force generated when the elastic element 13 returns back to the initial state from a compressed state. Therefore, when the connection between the sealing cover 12 and the crucible body 11 is released and the crucible body 11 is placed in the ambient atmospheric atmosphere (i.e., at step 5), it can be ensured that the differential pressure between the ambient atmosphere and the crucible body 11 is enough to maintain the sealed contact between the sealing cover 12 and the crucible body 11 without the sealing cover 12 being opened by the elastic element 13.

In order to further reduce the deterioration of the material due to the contact with the moisture and oxygen in the air, before step 1, the evaporation method may further include: filling the box body 21 of crucible body 11 with an inert gas, so that the material to be evaporated is always in an inert gas atmosphere prior to evaporation, and without contact with water vapor and oxygen, thereby preventing the deterioration of the material.

The above is a description of the crucible, evaporation preparation device, evaporation equipment and evaporation method provided by the present disclosure. It can be seen that when the material to be evaporated is filled into the crucible body before the evaporation, the material in the crucible body does not contact with water vapor, oxygen and the like in course of placing the material in the crucible and sealing the opening with the sealing cover before the sealing cover is opened, thereby preventing the material from deteriorating, and improving the evaporation effect.

It will be understood that the exemplary embodiments of the present disclosure have been described for illustrative purposes only. The disclosure scope is not so limited. Those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A crucible, comprising:
a crucible body having an opening at the top thereof;
a sealing cover having a detachable connection with the crucible body, thereby the sealing cover is configured to seal the crucible body in a first position and open the crucible in a second position; and
an elastic element arranged between the sealing cover and the crucible body, wherein the elastic element is in a compressed state when the crucible is sealed by the sealing cover in the first position,
wherein the elastic element comprises a torsion spring; one end of the torsion spring is arranged on the crucible body, and the other end of the torsion spring is arranged at a first edge of the sealing cover; the sealing cover is detachably connected to the crucible body by a connector at a second edge of the sealing cover opposite to the first edge,
the crucible body comprises a bottom wall and a side wall; the side wall of the crucible body comprises an upright portion and a horizontal extension portion; one end of the horizontal extension portion is connected to the top end of the upright portion, and the other end of the extending portion extends toward the outside of the crucible body; and
one end of the torsion spring is arranged on the horizontal extension portion; the horizontal extension portion of the crucible body is detachably connected to the second edge of the sealing cover opposite to the first edge by the connector.

2. The crucible according to claim 1, wherein the connector comprises a snap-fit; one end of the snap-fit is articulated to the sealing cover, and the other end of the snap-fit is provided with a hook for being blocked and connected with the horizontal extension portion.

3. The crucible according to claim 1, wherein a first sealing gasket is arranged on the horizontal extension portion, and the first sealing gasket is a closed annular structure surrounding the axis of the crucible body.

4. The crucible according to claim 1, wherein a bottom surface of the cover body, and the second sealing gasket is a closed annular structure surrounding the axis of the sealing cover.

5. An evaporation preparation device, comprising:
a glove box and a crucible configured to be disposed in the glove box, the crucible comprising:
a crucible body having an opening at the top thereof;
a sealing cover having a detachable connection with the crucible body, thereby the sealing cover is configured to seal the crucible body in a first position and open the crucible in a second position; and
an elastic element arranged between the sealing cover and the crucible body, wherein the elastic element is in a compressed state when the crucible is sealed by the sealing cover in the first position,
wherein the elastic element comprises a torsion spring; one end of the torsion spring is arranged on the crucible body, and the other end of the torsion spring is arranged at a first edge of the sealing cover; the sealing cover is detachably connected to the crucible body by a connector at a second edge of the sealing cover opposite to the first edge, the crucible body comprises a bottom wall and a side wall; the side wall of the crucible body comprises an upright portion and a horizontal extension portion; one end of the horizontal extension portion is connected to the top end of the upright portion, and the other end of the extending portion extends toward the outside of the crucible body; and one end of the torsion spring is arranged on the horizontal extension portion; the horizontal extension portion of the crucible body is detachably connected to the second edge of the sealing cover opposite to the first edge by the connector.

6. The evaporation preparation device according to claim 5, wherein the glove box comprises a box body and a glove; the box body is provided with an inlet, an inlet door for opening and closing the inlet, and a glove joint; the glove forms a sealed connection with the glove joint.

7. The evaporation preparation device according to claim 6, wherein the inlet is configured for the crucible to enter the box body through the inlet.

8. The evaporation preparation device according to claim 7, the box body is provided with a gas pressure regulation structure for regulating the gas pressure within the box body.

9. The evaporation preparation device according to claim 5, wherein the box body is provided with a gas inlet, the gas inlet is communicated with a source of an inert gas.

10. An evaporation equipment, comprising an evaporation chamber communicated with an evacuating device; wherein the evaporation equipment further comprises the evaporation preparation device according to claim 5.

11. An evaporation equipment, comprising an evaporation chamber communicated with an evacuating device; wherein the evaporation equipment further comprises the evaporation preparation device according to claim 6.

12. An evaporation equipment, comprising an evaporation chamber communicated with an evacuating device; wherein the evaporation equipment further comprises the evaporation preparation device according to claim 7.

13. An evaporation equipment, comprising an evaporation chamber communicated with an evacuating device; wherein the evaporation equipment further comprises the evaporation preparation device according to claim 8.

14. An evaporation equipment, comprising an evaporation chamber communicated with an evacuating device; wherein the evaporation equipment further comprises the evaporation preparation device according to claim 9.

* * * * *